United States Patent
Song et al.

(10) Patent No.: US 10,921,356 B2
(45) Date of Patent: Feb. 16, 2021

(54) OPTICAL RF SPECTRUM ANALYSER

(71) Applicant: The University of Sydney, New South Wales (AU)

(72) Inventors: Shijie Song, Sydney (AU); Xiaoke Yi, West Ryde (AU)

(73) Assignee: The University of Sydney, New South Wales (AU)

( * ) Notice: Subject to any disclaimer, the term of this patent is extended or adjusted under 35 U.S.C. 154(b) by 76 days.

(21) Appl. No.: 16/327,002

(22) PCT Filed: Aug. 22, 2017

(86) PCT No.: PCT/AU2017/050889
§ 371 (c)(1),
(2) Date: Feb. 21, 2019

(87) PCT Pub. No.: WO2018/035560
PCT Pub. Date: Mar. 1, 2018

(65) Prior Publication Data
US 2019/0212377 A1 Jul. 11, 2019

(30) Foreign Application Priority Data
Aug. 22, 2016 (AU) .................................. 2016903330

(51) Int. Cl.
G01R 23/17 (2006.01)
(52) U.S. Cl.
CPC .................................... G01R 23/17 (2013.01)
(58) Field of Classification Search
CPC .................................................... G01R 23/17
See application file for complete search history.

(56) References Cited

U.S. PATENT DOCUMENTS 4,695,790 A 9/1987 Mathis
4,928,318 A * 5/1990 Ibe ........................ H04B 14/026
332/112

(Continued)

FOREIGN PATENT DOCUMENTS

EP 0586889 A2 3/1994

OTHER PUBLICATIONS

International Search Report dated Nov. 3, 2017 for PCT Application No. PCT/AU2017/050889.

*Primary Examiner* — Reena Aurora
(74) *Attorney, Agent, or Firm* — Moser Taboada

(57) ABSTRACT

This disclosure relates to optical RF spectrum analysers and methods for analysing an input RF signal. An optical modulator modulates an input RF signal onto a carrier frequency and an optical spectral weight with a spectral weight function modifies the modulated optical signal. The spectral weight defines a frequency relationship between the spectral weight function and the carrier frequency. A frequency control module modifies the frequency relationship between the spectral weight function and the carrier frequency over time. An optical sensor senses the modified optical signal over time and to generates an RF signal over time. A signal recovery module calculates the RF spectrum based on the RF signal over time. Shifting the spectral weight against the carrier frequency over time results in a high spectral resolution even if the spectral weight is relatively broad band. The result is an increased spectral resolution at a reduced price/complexity and increased robustness.

23 Claims, 8 Drawing Sheets

(56) References Cited

U.S. PATENT DOCUMENTS

| | | | | |
|---|---|---|---|---|
| 8,861,567 B2* | 10/2014 | Li | ................... | G01R 23/17 |
| | | | | 375/136 |
| 2013/0315590 A1 | 11/2013 | Zhou | | |
| 2014/0133521 A1 | 5/2014 | Li et al. | | |
| 2015/0207567 A1* | 7/2015 | Bogoni | ................ | H04B 10/64 |
| | | | | 398/115 |

* cited by examiner

OPTICAL RF SPECTRUM ANALYSER

CROSS-REFERENCE TO RELATED APPLICATIONS

The present application claims priority from Australian Provisional Patent Application No 2016903330 filed on 22 Aug. 2016, the content of which is incorporated herein by reference.

TECHNICAL FIELD

This disclosure relates to optical RF spectrum analysers and methods for analysing an input RF signal.

BACKGROUND

The increasing demand for expanding the functionality of electronic RF systems presents an unprecedented challenge to provide systems capable of recognizing microwave signals with high resolution and wide operating bandwidth. Various photonic-assisted channelization approaches exist to report the existence of detected microwave signals and perform instantaneous spectrum activity monitoring including parametric mixing, coherent optical frequency combs and stimulated Brillouin scattering. These schemes are based on the usage of multiple light sources which increases the system complexity and cost. Moreover, existing photonic-assisted channelized receivers are limited by the one-to-one relationship between optical filtering bandwidth and radiofrequency (RF) measurement resolution i.e. RF measurement resolution is solely dependent on the optical filtering bandwidth. For example, in order to have an RF measurement resolution of 20 MHz, it requires a highly selective optical filter with a 3 dB bandwidth of 20 MHz, which is extremely complex or even not possible to be achieved in optical fabrication.

This intrinsic limitation is caused by the spectral broadening effect between neighbouring frequency components caused by the limited bandwidth and selectivity of the optical filters. This significantly degrades the system ability to precisely retain the frequency information of the microwave signal. Furthermore, signal processing using silicon ring resonators is of great interest due to their compact size as well as compatibility with CMOS fabrication techniques. To produce highly selective optical filter with square top response and narrow passband (less than 100 MHz) for photonic-assisted channelized receiver, approaches use a large number of rings with critical coupling conditions and precise control of the dimension of each ring and each gap in the coupling. Such a complex technological process severely limits the feasibility of integrating channelized receiver on a single chip.

SUMMARY

An optical RF spectrum analyser comprises:
an optical modulator to modulate an input RF signal onto a carrier frequency;
an optical spectral weight having a spectral weight function to modify the modulated optical signal, the spectral weight defining a frequency relationship between the spectral weight function and the carrier frequency;
a frequency control module to modify the frequency relationship between the spectral weight function and the carrier frequency over time;
an optical sensor to sense the modified optical signal over time and to generate an RF signal over time;
a signal recovery module to calculate the RF spectrum based on the RF signal over time.

It is an advantage that modifying the relationship between the spectral weight function and the carrier frequency over time and then calculating the RF spectrum from the filtered RF signal over time results in a high spectral resolution even if the spectral weight is relatively broad band. This is an advantage over other methods that rely on an extremely narrow band filter, which is difficult and/or expensive to fabricate and/or operate. The result of the proposed method is increased spectral resolution at a reduced price/complexity and increased robustness.

The signal recovery module may be configured to perform a deconvolution of the RF signal over time based on the spectral weight function.

The deconvolution may be based on an analytical approximation of the spectral weight function.

The signal recovery module may be configured to perform the deconvolution of the RF signal over time by using a waveform of the RF signal over time as a frequency domain signal.

Using the waveform of the RF signal over time as a frequency domain signal may comprise creating a frequency axis associated with the RF signal over time based on a rate of modifying the frequency relationship between the spectral weight function and the carrier frequency over time.

The spectral weight may be a resonance. The resonance may be a ring oscillator.

The optical modulator may comprise a laser source to generate a laser at the carrier frequency. The frequency control module may be to modify the relationship between the spectral weight function and the carrier frequency by varying the carrier frequency. Varying the carrier frequency may comprise performing a sweep across a frequency range.

Modifying the relationship between the spectral weight function and the carrier frequency over time may be based on a rate of change per unit time and the signal recovery module may be to calculate the RF spectrum based on the rate of change.

A method for analysing an input RF signal comprises:
modulating the input RF signal onto an optical carrier frequency to generate a modulated optical signal;
modifying the modulated optical signal by applying a spectral weight having a spectral weight function, the spectral weight defining a frequency relationship between the spectral weight function and the carrier frequency;
modifying the relationship between the spectral weight function and the carrier frequency over time to generate a modified optical signal over time;
sensing the modified optical signal over time to generate an RF signal over time; and
calculating a spectrum of the input RF signal based on the RF signal over time.

Calculating the spectrum of the input RF signal may comprise performing a deconvolution of the RF signal over time based on the spectral weight function.

The deconvolution may be based on an analytical approximation of the spectral weight function.

Performing the deconvolution of the RF signal over time may comprise using a waveform of the RF signal over time as a frequency domain signal.

Using the waveform of the RF signal over time as a frequency domain signal may comprise creating a frequency axis associated with the RF signal over time based on a rate of modifying the frequency relationship between the spectral weight function and the carrier frequency over time.

Modifying the relationship between the spectral weight function and the carrier frequency may comprise varying a carrier frequency of a laser source.

Varying the carrier frequency may comprise performing a sweep across a frequency range.

Modifying the relationship between the spectral weight function and the carrier frequency over time may be based on a rate of change per unit time and calculating the RF spectrum is based on the rate of change.

A method for controlling an RF signal analyser, the method comprising:

generating a modulator control signal to control modulation of an input RF signal onto a carrier frequency by an optical modulator to modify a relationship between a spectral weight function and the carrier frequency over time, the spectral weight function characterising a spectral weight to modify the modulated optical signal;

receiving a sensed RF signal over time indicative of the modified signal created by the optical spectral weight; and calculating a spectrum of the input RF signal based on the RF signal over time.

BRIEF DESCRIPTION OF DRAWINGS

An example will now be described with reference to.

DESCRIPTION OF EMBODIMENTS

This disclosure provides a technology that breaks the one-to-one relationship between RF measurement resolution and optical bandwidth, provides a high RF measurement resolution without increasing the design and manufacture complexity, recovers both amplitude and frequency information of the microwave signals and enables the on-chip RF frequency measurement system.

Figure 1:
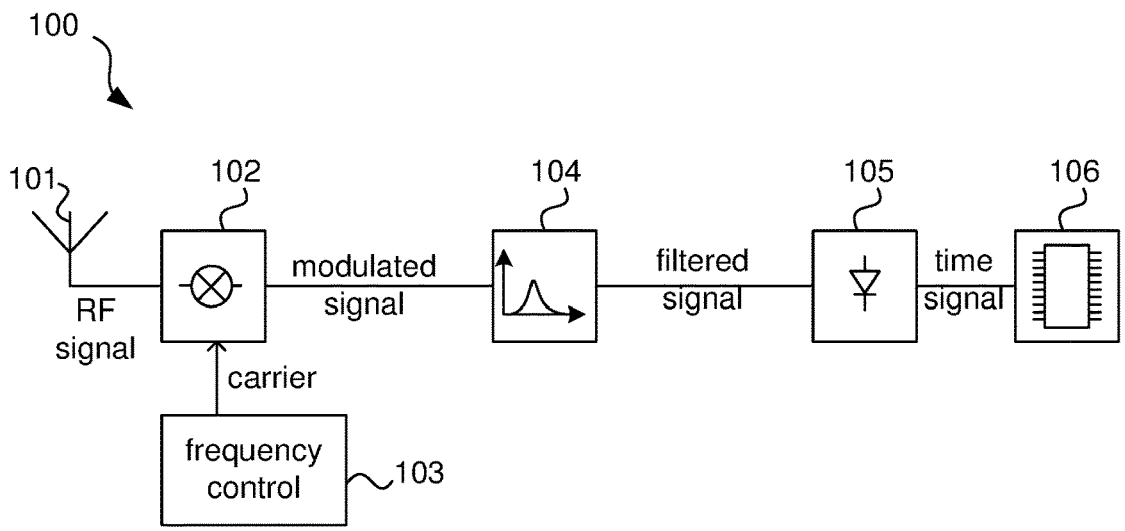
FIG. 1 illustrates an RF spectrum analyser.

FIG. 1 illustrates an RF spectrum analyser 100 comprising a signal input 101, a modulator 102, frequency control 103, spectral weight 104, such as a filter, optical field integrator 105 and signal recovery module 106.

Figure 2:
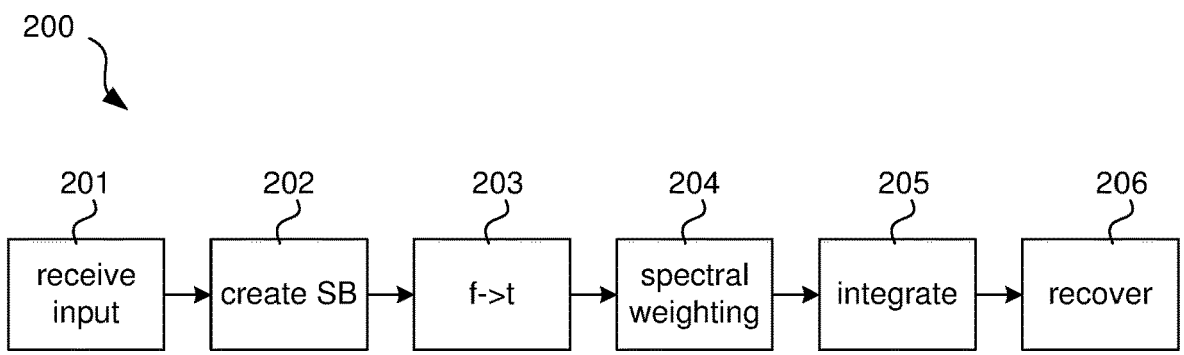
FIG. 2 illustrates a method for RF spectrum analysis.
Figure 3:
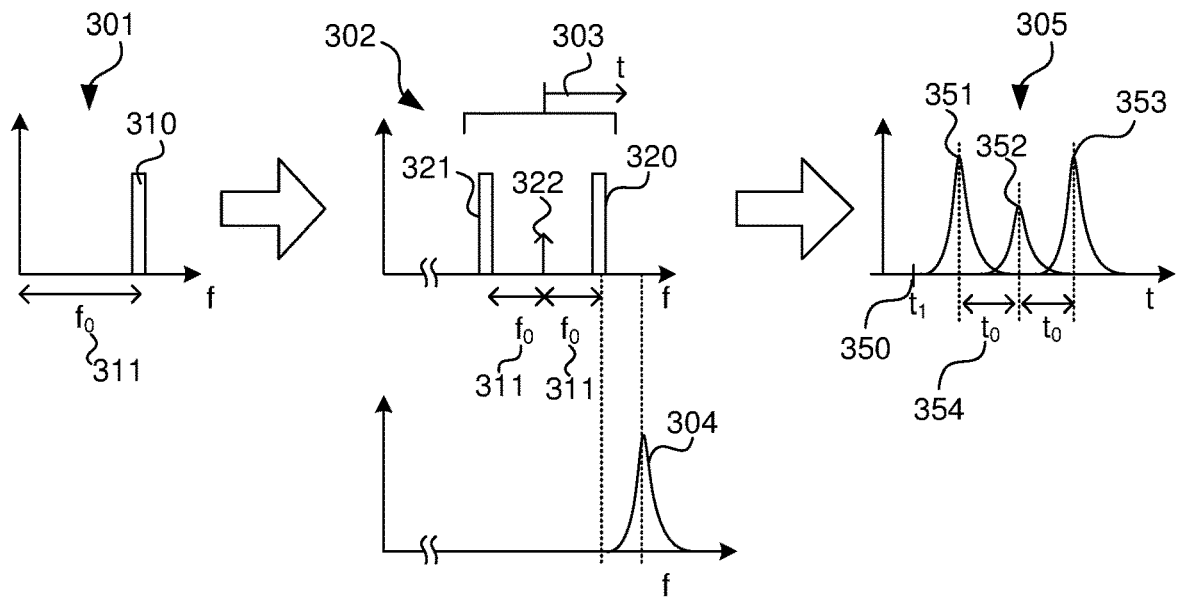
FIG. 3 illustrates schematically example signals within the RF spectrum analyser in FIG. 1.

FIG. 2 illustrates a method 200 for RF spectrum analysis and FIG. 3 illustrates a signal flow 300 for RF spectrum analysis. The reference numerals in FIGS. 1, 2 and 3 correspond to each other in the sense reference numerals 101, 201 and 301 correspond to each other.

When in use, signal input 101 receives 201 an input signal 301, modulator 102 creates 202 a modulated signal 302 with optical sidebands. Frequency control 103 maps 203 the frequency signal 302 into a time domain 303 and spectral weight 104 applies 204 a spectral weight 304 to the time domain signal. Finally, the frequency integrator 105 integrates 205 the signal to create an integrated time signal 305 and the signal recovery module 106 recovers 206 the signal to calculate the RF spectrum of the input signal 301.

The input 101 may be an antenna that receives a spectrally limited (narrowband) input signal. In the frequency spectrum of input signal 301 the narrow band signal is shown at 310. For simplicity of explanation, it is assumed that the narrow band signal 310 is symmetrical around centre frequency 311. In other words, the middle of narrow band signal 310 is spaced apart from the origin of the frequency axis by the centre frequency 311. It is noted, however, that the input signal can have any spectrum and in most cases, the input spectrum is unknown.

The modulation in step 202 by modulator 102 generates an upper sideband 320 and a lower sideband 321. As a result of the modulation, the centre of the upper sideband 320 and the lower sideband 321 are spaced apart from a modulator frequency 322 by the centre frequency 311. The centre frequency 311 may be the optical frequency of a laser. Since optical frequencies are by magnitudes higher than radio frequencies the frequency axis is broken in FIG. 3. An example RF centre frequency 311 may be 20 GHz and an example optical frequency of carrier 322 may be 195 THz.

The frequency control 103 maps 203 the modulated signal 302 into the time domain by sweeping the carrier frequency 322 from a low optical wavelength to a high optical wavelength, such as from 1546.45 nm to 1547.25 nm. In effect, this shifts the sidebands 320, 321 as well as the carrier 322 rightwards over time as indicated by time arrow 303. In one example, the sweep rate is 10 MHz per 1 ms.

It is noted that applying integrator 105, such as a photodiode, to the modulated and time-mapped signal 302 directly would result in insignificant changes over time as most integrators are wideband and effectively integrate the entire spectrum of modulated signal 302. Therefore, shifting the sidebands 320, 321 and carrier would result in little or no useful change over time. However, before integrator 105 is applied, a spectral weight 104 is applied to the signal. The spectral weight may be an optical resonance and an example frequency response is plotted at 304 in FIG. 3. Applying a spectral weight basically means multiplying the frequency spectrum 302 at each frequency with the spectral weight 304 at that frequency and then integrating across the entire frequency range. This is also referred to as convolution in the time domain, which becomes the multiplication in the frequency domain.

At the relative position of modulated signal 302 and spectral weight 304 shown in FIG. 3 it can be seen that there is no overlap between the two signals. In other words, at every point on the frequency axis at least one of the signals is zero. As a result, the product of the two signals is also zero along the entire frequency axis. Integrating a zero signal results in a zero output which is shown at time $t_1$ 350 at integrated time signal 305. As the modulated signal 302 is shifted 303 to the right over time, the upper sideband 320 starts moving over the spectral weight 304 and the product of the upper sideband and the spectral weight becomes non-zero. Over time, the overlap grows which is indicated by a first peak 351 of integrated time signal 305. As the upper sideband 320 moves out of the spectral weight 304, the integrated time signal 305 falls back towards zero until the carrier 322 move across the spectral weight 304 resulting in a second peak 352. Similarly, the lower sideband moving across the spectral weight 304 results in a third peak 353.

In other words, the overlapping of spectra may be described as a frequency relationship between the spectral weight function 304 and the carrier frequency 322. The frequency relationship is defined by the spectral weight in the sense that the spectral weight defines the relative positioning or alignment between the carrier frequency 322 and the spectral weight function 304. This may comprise a fixed spectral weight function, such as implemented by an fixed optical ring oscillator. In other examples, the spectral weight may be tuneable such as by tuning the optical ring oscillator or by using an optical processor. Regardless of the tuning, the spectral weight defines a frequency relationship between the carrier frequency 322 and the spectral weight function 304. A particular spectral relationship may be that the spectral weight function is located at a significantly higher frequency than the carrier, is located 10 GHz above the carrier or is located above the carrier by more than the upper sideband 320 frequency. Modifying the frequency relationship over time may comprise the above mentioned sweep and causes the overlap as described above.

In one example, the three peaks 351, 352 and 353 are clearly separated as shown in integrated time signal 305 in FIG. 3. In this case, the recovery module 106 can detect the three peaks 351, 352 and 353 as the local maxima and measure the time $t_0$ 354 between the upper sideband peak 351 and the carrier peak 352. This time $t_0$ 354 is indicative of the time between the overlap of the upper sideband 320 over the spectral weight 304 and the carrier 322 over the spectral weight. In other words, the time $t_0$ is indicative of the time period during which the modulated signal spectrum was shifted by $f_0$. Since the rate of the shift, that is the sweep rate in Hz/s is known or pre-configured as the input to the frequency control 103, the frequency $f_0$ can be calculated by $f_0 = \text{rate} * t_0$. This shows that the spectral weight 304 can be relatively broad band without significantly reducing the spectral resolution of the output as long as the peaks 351, 352 and 353 can be distinguished.

In other examples, however, the three peaks 351, 352 and 353 are more difficult to distinguish due to strongly overlapping peaks. In this case, the recovery module 106 can apply a deconvolution algorithm to the time signal. It is noted that many processes in signal processing are described by a convolution of two time signals, such as an input signal and a filter response, which can be transformed into a multiplication in frequency space. In contrast, here the convolution occurs in frequency space between the modulated signal 302 and the spectral weight spectrum 304 but the output is a time domain integrated time signal 305. However, it is possible to replace the time axis of the integrated time signal 305 by a frequency axis according to the sweep rate. For example, if the sweep rate is 10 MHz per second, the recovery module can multiply the time values on the time axis of integrated time signal 305 by 10 MHz/s to convert them to frequencies and apply an offset if applicable. The waveform of the integrated time signal 305 can then be passed as a frequency domain signal using the determined frequency axis to a deconvolution algorithm in order to calculate an estimate of the original signal 302. The deconvolution may be performed by a processor of a computing system, such as by executing Python code from the scipy.signal.deconvolve package. In other examples, an FPGA performs the deconvolution.

The accuracy of the deconvolution result can be increased by using the actual spectrum of the spectral weight 204 or an approximation thereof. One approximation may be a Gaussian distribution. A more accurate approximation may be a Dirac impulse.

In summary, the spectrum analysis system can be realized via 5 signal processing steps in both optical and electrical domain, which include optical sideband (OSB) generation, frequency-to-time mapping, spectral weighting, optical field integration and signal recovery. First, the input RF signal is applied onto the optical carrier generated by an optical source via an electro-optic modulation, hence realizing the optical sideband generation. Second, the optical sideband information in the optical spectrum is translated into a waveform in time domain via frequency-to-time domain mapping where its intensity profile becomes a scaled replica of its optical spectrum. Third, the time-varying waveform is transmitted through a spectral weight module, such as an optical filter, where its intensity at the output at each time instance is weighted according to the contributing frequency component. Fourth, an optical field integrator such as photodetector or optical powermeter is employed to measure the exact light intensity at each time instance. Finally, a signal recovery module based on the deconvolution theorem is used to reconstruct the input RF signal spectrum from the light intensity measured by the optical field integrator.

Applications of this technology includes:
Scanning receivers;
RF spectrum analysis;
Optical spectrum analysis;
Photonic signal processing;
Integrated photonic chip; and
Radar.

Figure 4:
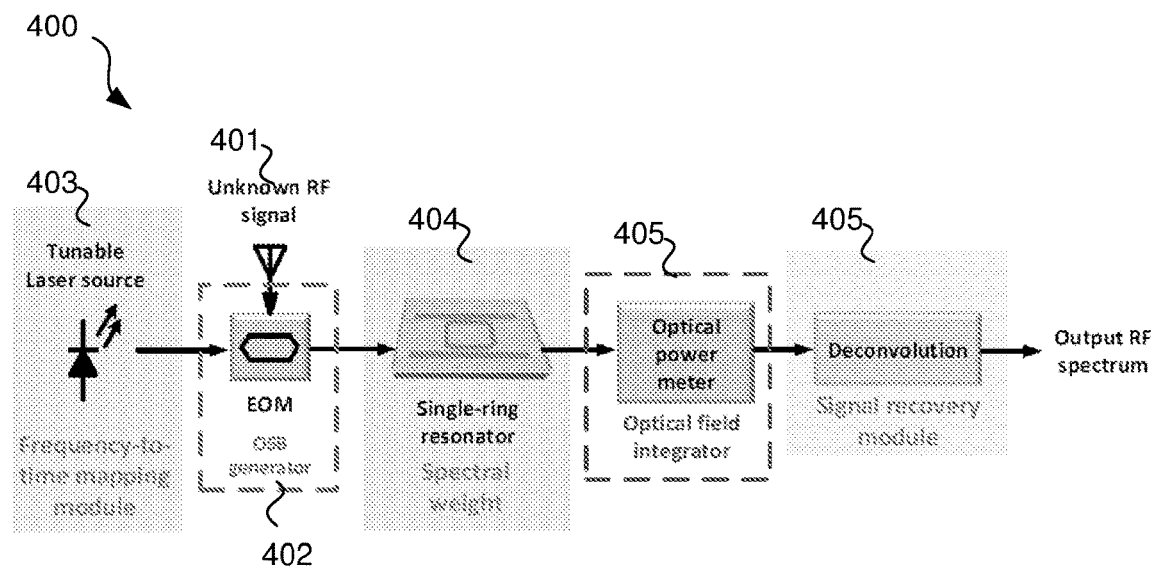
FIG. 4 illustrates an experimental setup of the photonic assisted RF measurement.
Figure 5A:
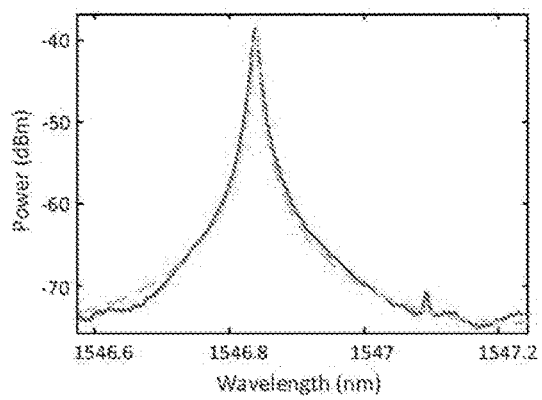
FIG. 5a illustrates measured (solid line) and simulated (dashed line) spectral responses of the optical filter.
Figure 5B:
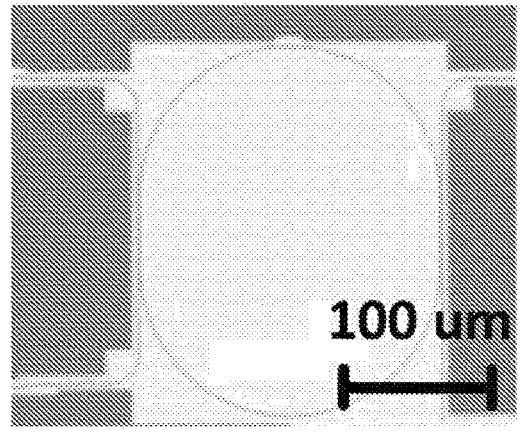
FIG. 5b is a top-view microscope image of the fabricated silicon photonic single-ring add-drop filter.

To verify the concept of deconvolution, experiments were conducted based on the setup 400 shown in FIG. 4 comprising an input 401 to provide an unknown RF input signal to an optical sideband generator 402 modulated by a tuneable laser source 403. It is noted that the attainable frequency measurement range is predominantly limited by the optical sideband generator employed in the system. Current developments in electro-optic modulators provide a modulation bandwidth greater than 100 GHz, which can facilitate the proposed system with an ultra-wide band RF spectrum analysis. The modulated signal is fed into a single ring resonator 404 acting as a spectral weight, which is connected to an optical field integrator 405 that provides a signal to a signal recovery module 405. In experiment, a tunable laser (Keysight) 403 with a constant sweeping rate of 80 nm/s was swept from 1546.45 nm to 1547.25 nm. This gives 4000 points and an overall sweeping duration of about 10 ms, where 1 microsecond time interval in time domain corresponds to a frequency change of 10 MHz. For other applications such as optical spectrum analysis where a wideband measurement is required, the sweeping range can be further extended, e.g. C+L band. The optical filter 404 to provide spectral weighting in the system 400 is based on a single ring resonator centered at 1546.85 nm with a 3 dB bandwidth of about 1.4 GHz. The measured optical spectrum of the filter is shown in FIG. 5a.

Figure 5C:
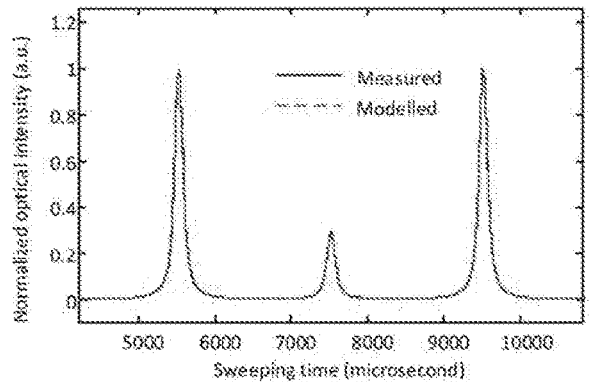
FIG. 5c illustrates measured and modelled output light intensity.
Figure 5D:
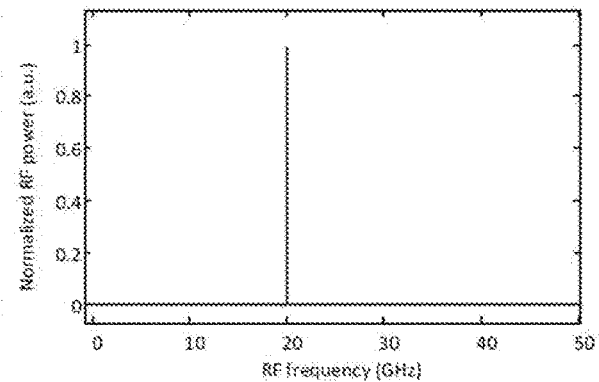
FIG. 5d illustrates the estimated RF signal frequency at 20 GHz.

Firstly, an input microwave signal 401 with RF frequency of 20 GHz was used in the test. FIG. 5c shows the measured light intensity waveform at the output of optical field integrator 405 which was an optical power meter in the experiment. The results shows the mapping of optical power intensity onto the time domain, the effect of OSB generation 402 and the weighting of optical intensities. The estimated frequency of the RF signal at the output of the signal recovery module 406 is shown in FIG. 5d. The recovery of the input signal is done through an inverse transformation via various existing signal deconvolution algorithms. For example, the blind deconvolution methods for image and audio processing applications can be adapted and used in the recovery module.

The measurement error is less than 25 MHz which is much less than the filter bandwidth of 1.4 GHz.

Figure 6A:
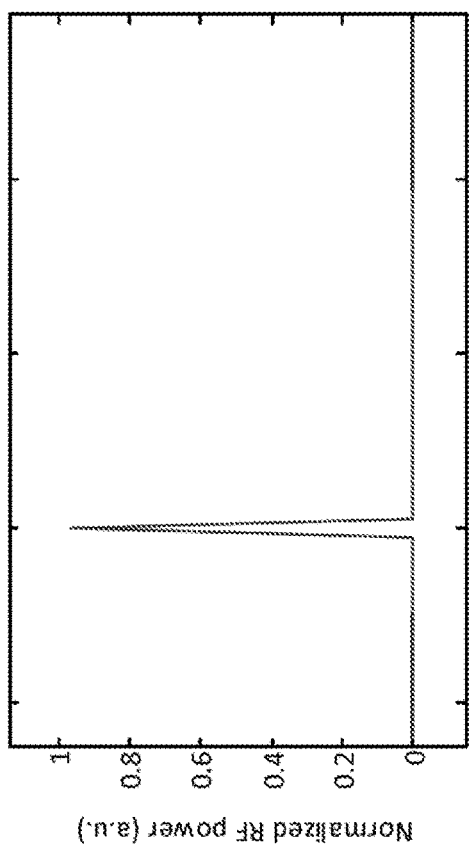
FIG. 6a illustrates a measured and modelled output light intensity.
Figure 6B:
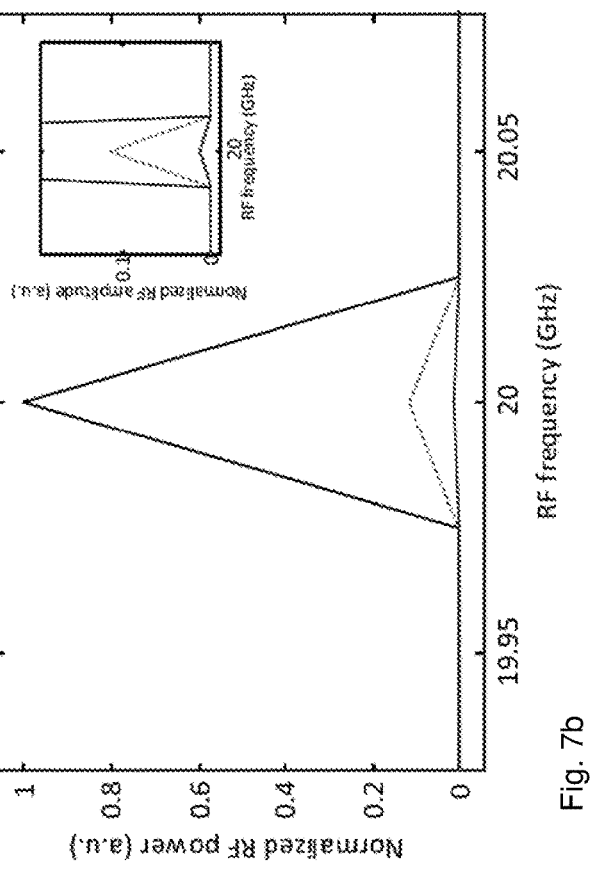
FIG. 6b illustrates an estimated RF signal when the input RF frequency is 0.5 GHz.

FIGS. 6a and 6b depict the measurement when the input microwave frequency is reduced to 0.5 GHz which is much smaller than the 3 dB bandwidth of the optical filter. Although the output light intensity of the optical power meter is broadened to a single peak as can be seen from FIG. 6a, the frequency of the RF signal can be accurately identified via the new technology as shown in FIG. 6b.

Figure 7A:
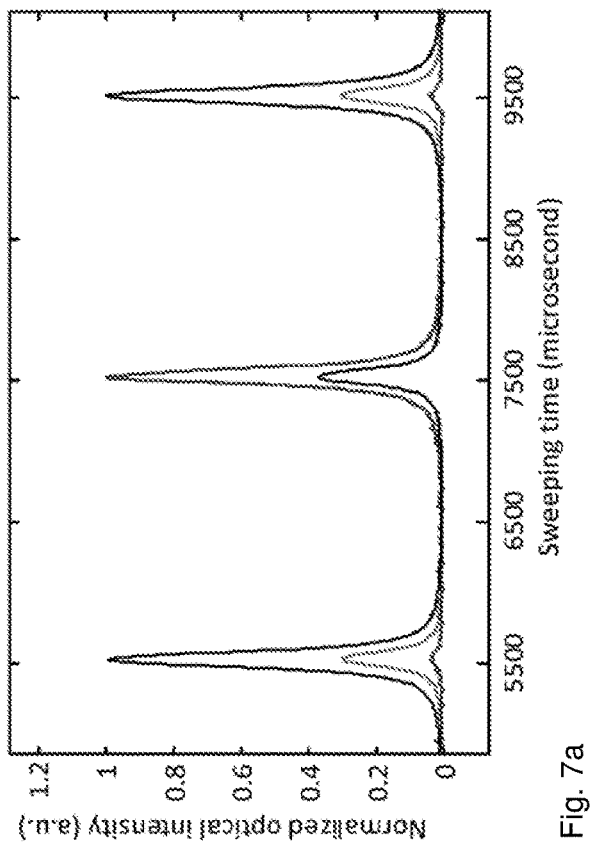
FIG. 7a illustrates measured output light intensity and FIG. 7b illustrates estimated RF when the input RF frequency is at 20 GHz and its power is varied. Inset: Magnified estimation result. Top solid: 0 dBm RF power; Middle dashed: −10 dBm RF power; Bottom solid: −20 dBm RF power.
Figure 7B:
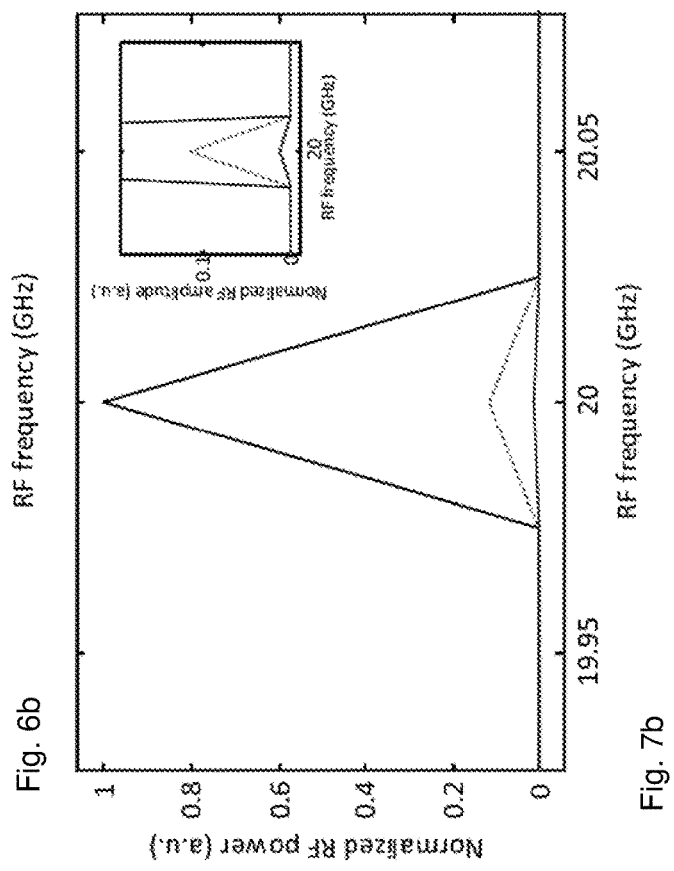

FIG. 7a and FIG. 7b respectively show the measured light intensity waveform and the estimated modulated signal when the input RF frequency was fixed at 20 GHz and its power was varied. As can be seen, the technology successfully recovers both the amplitude and frequency of the signal. The estimated amplitude errors are 0.72, 0.126 and 0.06 dB at 0 dBm, −10 dBm and −20 dBm input RF power respectively.

Combining the frequency-to-time mapping module and the spectral weight module with the optical field integrator and a signal recovery module enables the reconstruction of input RF signal spectra with high resolution and also significantly reduces the design and manufacture complexity. This technology improves the measurement resolution and operating bandwidth and breaks the one-to-one relationship between RF measurement resolution and optical bandwidth, recovers both amplitude and frequency information of the microwave signals and also enables the on-chip RF frequency measurement system. The proposed solution to microwave frequency measurement is insensitive to the wavelength drifting of the optical source and devices as the optical carrier and sidebands information provide self-reference functions.

As mentioned above, the deconvolution may be performed by a processor of a computer system, such as recovery module 106. This processor may also perform controlling tasks of the spectrum analyser 100, such as under the instructions of software code that is stored on program memory connected to the processor. These controlling tasks may include generating a modulator control signal to control modulation of the input RF signal 101 onto a carrier frequency 322 by optical modulator 102 to modify a relationship between a spectral weight function 104 and the carrier frequency 322 over time. This basically means that there is another connection in FIG. 1 between the recovery module 106 and the frequency control 103. The processor further receives the sensed RF signal over time 305 indicative of the modified signal created by the optical spectral weight 104. The processor then calculates a spectrum of the input RF signal based on the RF signal over time, such as by applying a deconvolution algorithm to the RF signal over time as described above.

Further Embodiments

The following description provides further embodiments. In general, the last two digits of reference numerals indicate corresponding features, in the sense that, for example, RF signal 801 in FIG. 8 corresponds to RF signal 101 in FIG. 1.

Figure 8:
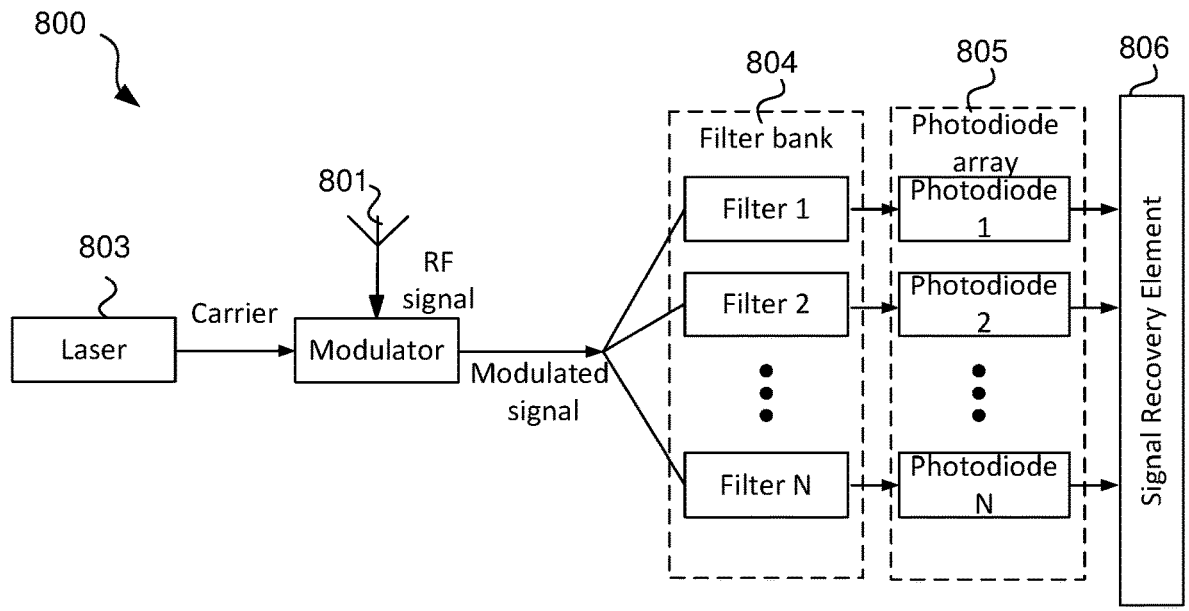
FIG. 8 illustrates a schematic diagram of an RF spectrum analyser based on a filter bank.

FIG. 8 shows the schematic diagram of another method for optical RF spectrum analysis, which employs a filter bank 804 to modify the relationship between the spectral weight function 804 and the carrier frequency 803 without varying the carrier frequency 803. The modulated optical signal is generated by modulating the RF signal 801 of interest onto the fix-wavelength carrier signal from laser 803. It is then evenly split and sent to a bank of narrow-band optical filters 804 with identical line shapes. Each individual filter is centered at a distinct frequency ($f_1, f_2, \ldots f_N$) with a constant spacing. It is noted that the relationship between the carrier and the individual filters is changed over time as described before, such as by sweeping the carrier frequency. The use of multiple filters as shown in FIG. 8 reduces the time required for the analysis. For example, with four filters only a quarter of the analysis time for one filter is required.

Figure 9:
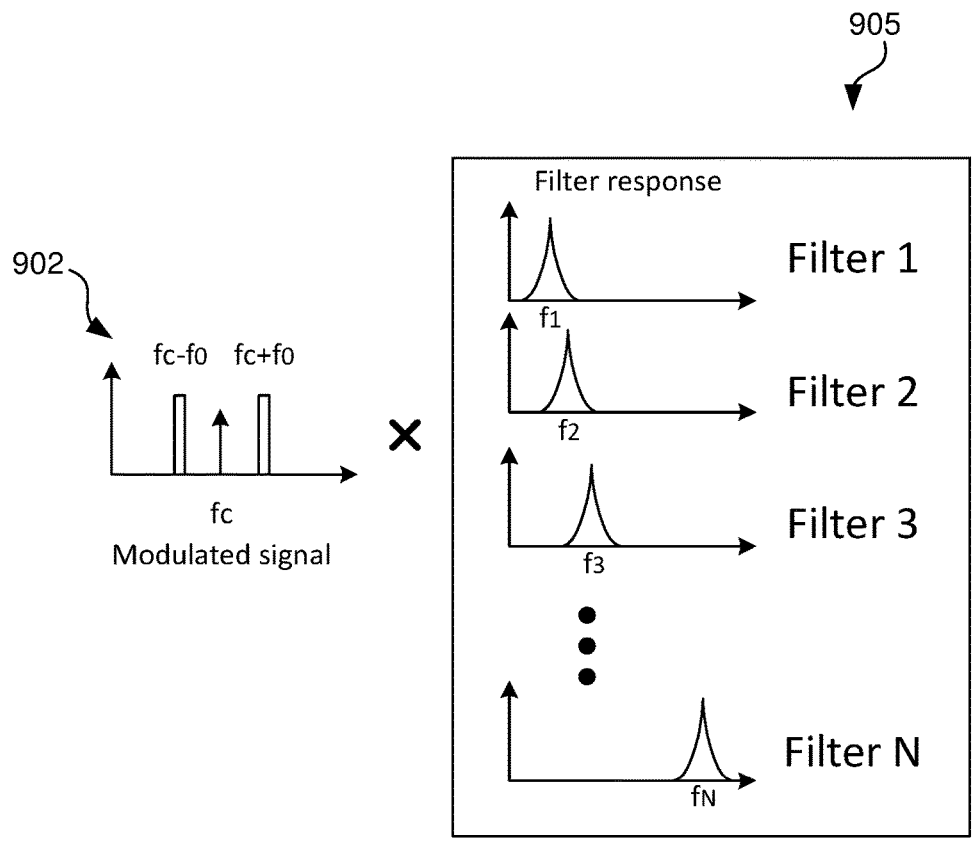
FIG. 9 illustrates the spectra of the RF spectrum analyser in FIG. 8.

FIG. 9 shows how each split portion of the modulated signal is multiplied with a shifted spectral weight. The weighted spectrum of the modulated signal is then sent to a photodiode 805 where integration over the entire spectrum of modulated signal is implemented. At the signal recovery element 806, the power outputs of the photodiodes are stitched up and deconvolved with the filter line shape, thus the real-time spectrum of the input RF signal is obtained.

Figure 10:
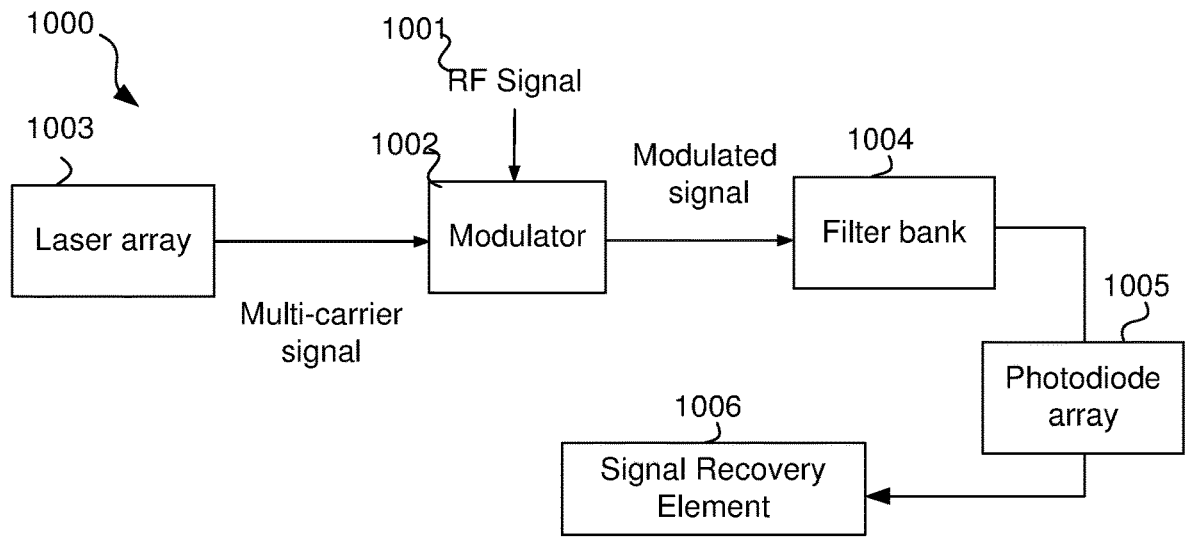
FIG. 10 illustrates a schematic diagram of an RF spectrum analyser based on a laser-filter array.

FIG. 10 illustrates another example 1000 of using the filter bank 1004 to realize the RF spectrum analyser. A laser array 1003 is used to generate multiple carrier signals at different frequencies ($fc_1, fc_2, \ldots fc_{2N}$). Then, the carrier signals are injected to the modulator 1002. RF information is mapped to every carrier signal, hence generating 2N copies of the modulated signal centered at $fc_1, fc_2, \ldots fc_{2N}$, respectively. It is then evenly split and sent to a bank of narrow-band optical filters 1004 with identical line shapes. By tuning the center frequencies of the filters in the filter bank 1004, the relative spacing between the n-th ($1 \leq n \leq N$) copy of the modulated signal and filter position is $n\Delta f$, thus each filter output is the product of the shifted spectral weight function and the modulated signal.

Figure 11:
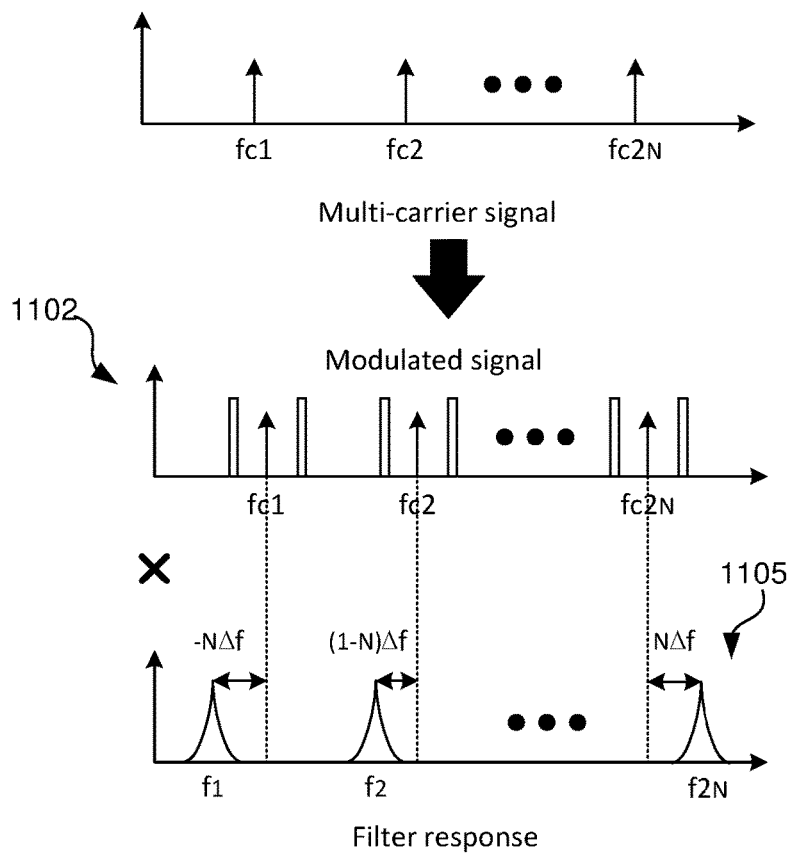
FIG. 11 illustrates the spectra of the RF spectrum analyser in FIG. 10.

FIG. 11 illustrates the spectra of the RF spectrum analyser based on a laser-filter array.

Figure 12:
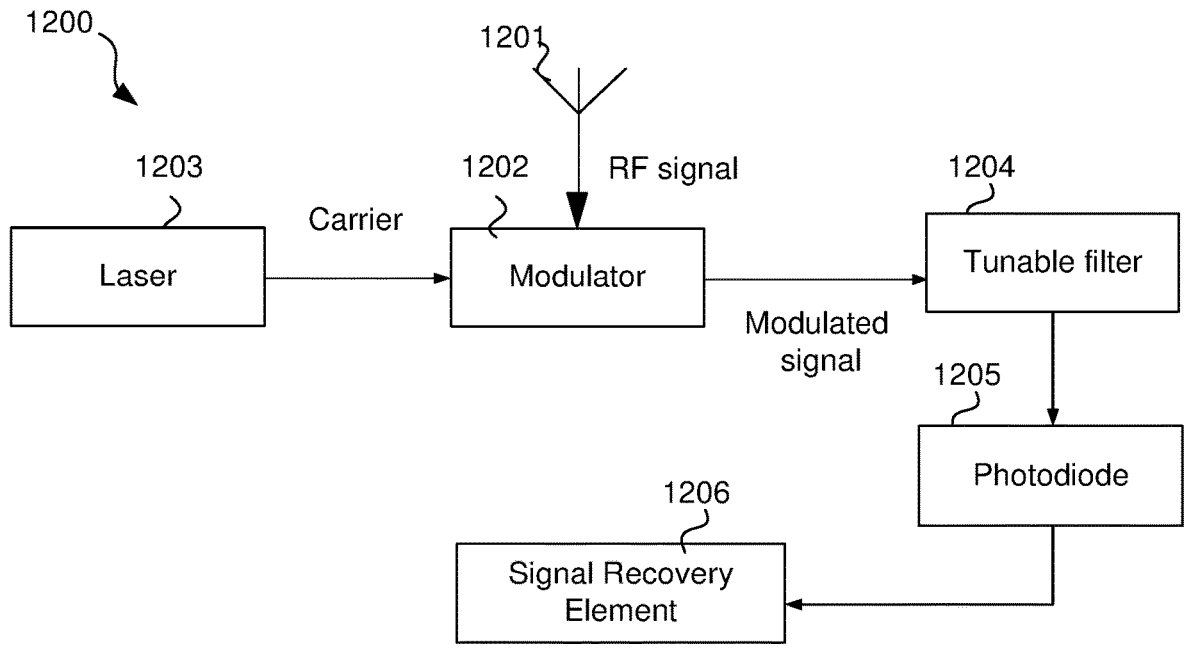
FIG. 12 illustrates a schematic diagram of an RF spectrum analyser based on a tunable filter.
Figure 13:
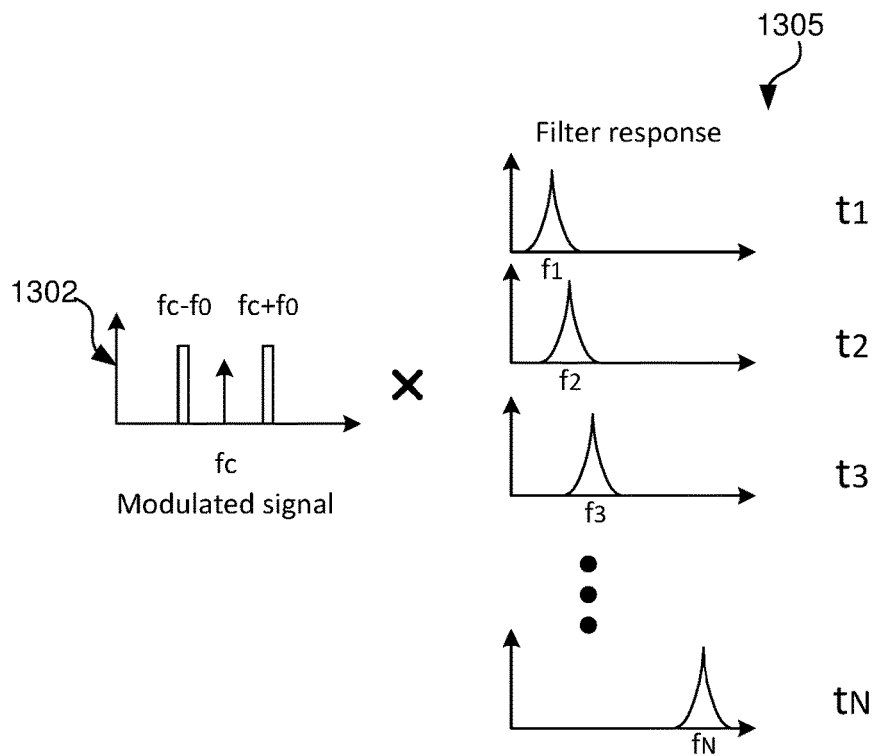
FIG. 13 illustrates the spectra of the RF spectrum analyser in FIG. 12.

The relationship between the spectral weight function can also be modified over time by using a tunable optical filter. FIG. 12 shows the schematic diagram of an optical RF spectrum analysis system 1200 based on a laser source 1203 which generates a fixed-wavelength carrier, a modulator 1202, a tunable optical filter 1204, a photodiode 1205 and a signal recovery element 1206. By varying the center frequency of the tunable filter 1204 with a fixed speed rate, the optical filter is of distinct location at each time instance ($t_1$, $t_2$, ... $t_N$) as shown in FIG. 13, a sweep across a frequency range can be achieved.

Figure 14:
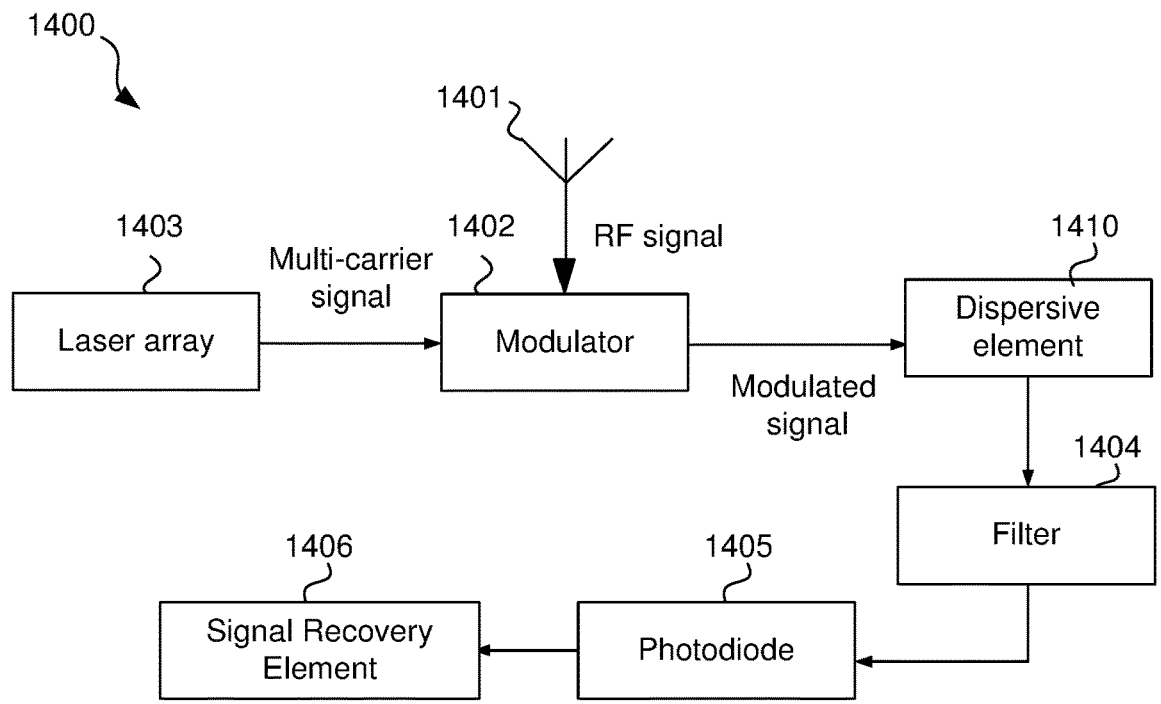
FIG. 14 illustrates a schematic diagram of the RF spectrum analyser based on a dispersive element.
Figure 15:
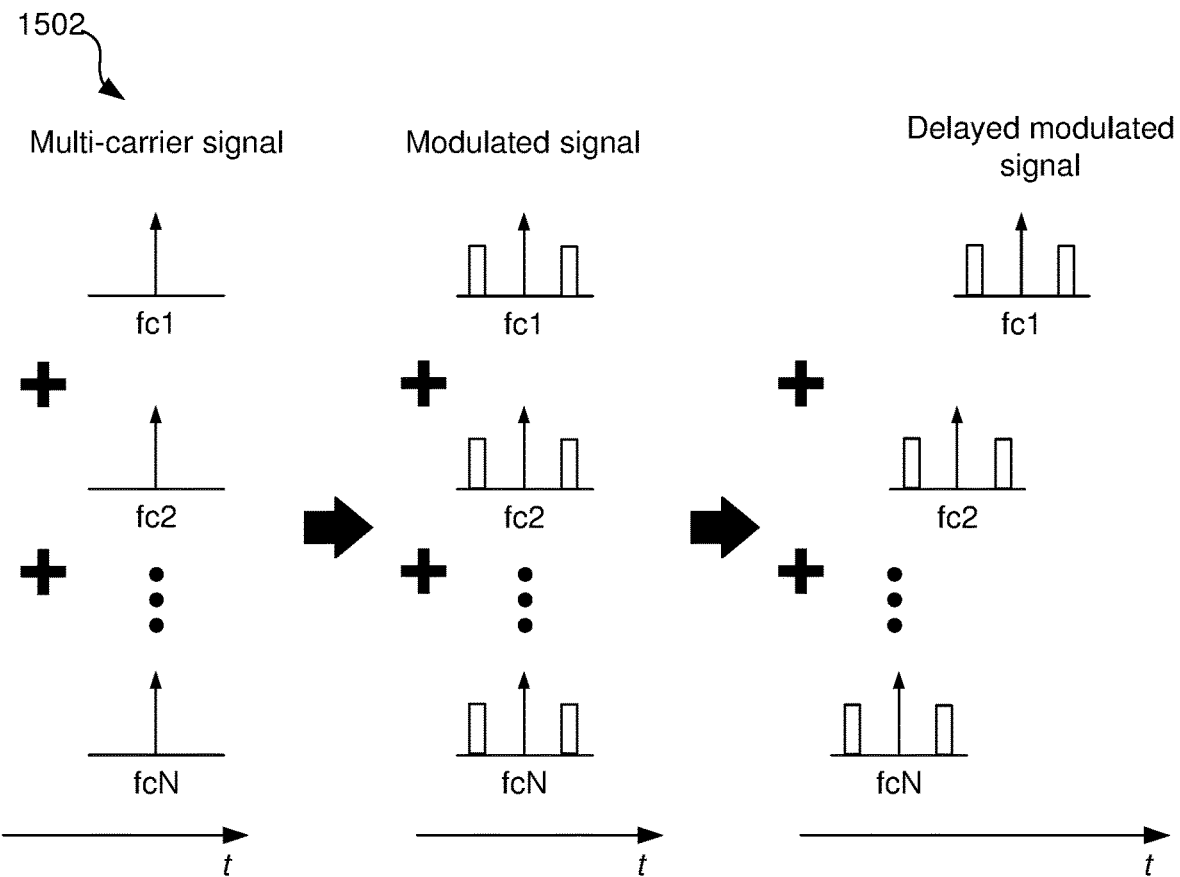
FIG. 15 illustrates the spectra of the RF spectrum analyser in FIG. 14.

FIG. 14 shows another example. As shown in FIG. 14, the laser array 1403 generates multiple carrier signals with a constant frequency spacing ($fc_1$, $fc_2$, ... $fc_N$). The optical carrier signals are injected to the modulator 1402 to obtain N copies of the modulated optical signal 1401 centered at $fc_1$, $fc_2$, ... $fc_N$ and then the output of the modulator is sent to a delay element 1410 (e.g. dispersive delay line). The time delay provided by the delay element is optical frequency dependent, which indicates each copy of the modulated signal will arrive at the filter 1404 at a different time. If a dispersive element with a linear delay slope is employed in the system as an optical delay line 1410, it leads to a constant time delay between the n and n+1 ($1 \leq n \leq N$) copies of the modulated signal. Thus the relationship between the spectral weight function and the RF spectrum over time is controlled by the dispersion characteristic of the dispersive element. FIG. 15 illustrates the corresponding spectra.

Figure 16:
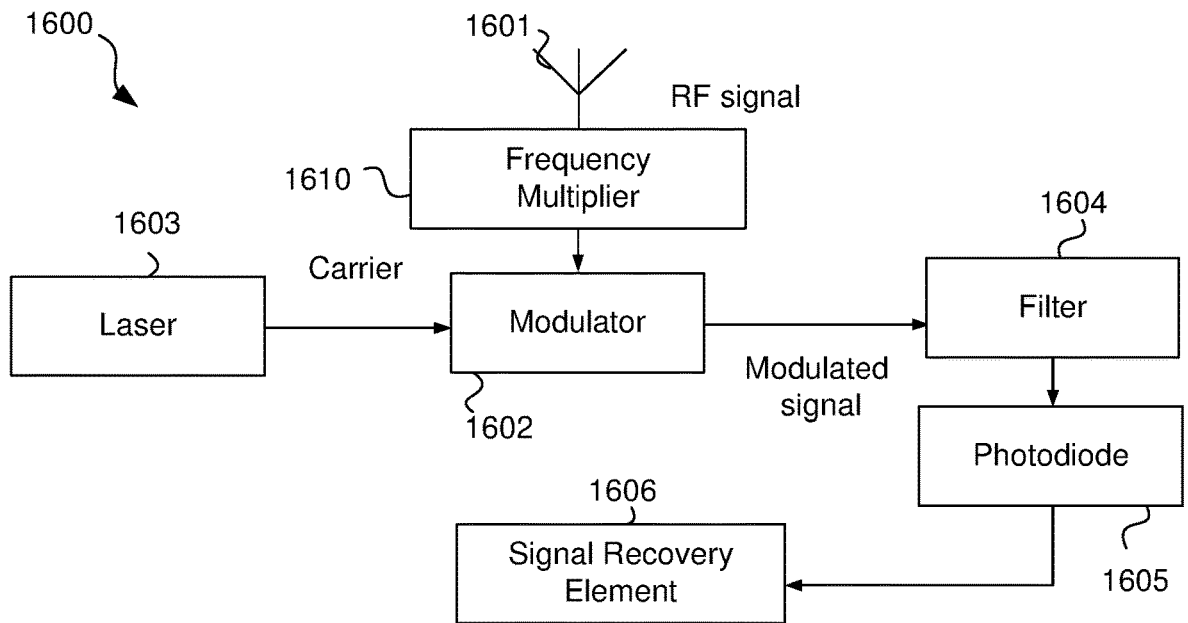
FIG. 16 illustrates a schematic diagram of the RF spectrum analyser based on an RF multiplier.
Figure 17:
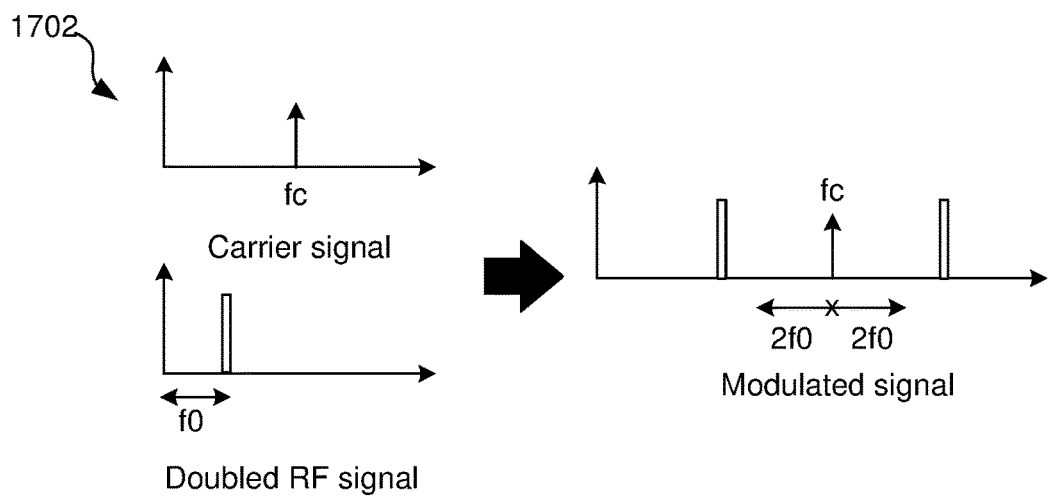
FIG. 17 illustrates the spectra of the RF spectrum analyser in FIG. 16.

FIG. 16 illustrates how instead of applying the input RF signal 1601 directly onto the carrier signal generated by the laser source 1603, RF signal 1601 can be sent firstly to a frequency multiplier 1610 then followed by a modulator 1602. For example, a frequency doubler could double the input RF frequency as shown in FIG. 17, thus the relative spacing between the carrier signal and the sidebands is also increased by a factor of 2 in optical frequency domain before being injected to the spectral weight module. By varying the ratio of the multiplier 1610, the sideband of the modulated signal is allocated at distinct location at each time instance. Thus, a sweep across a frequency range can be achieved.

It will be appreciated by persons skilled in the art that numerous variations and/or modifications may be made to the above-described embodiments, without departing from the broad general scope of the present disclosure. The present embodiments are, therefore, to be considered in all respects as illustrative and not restrictive.

The invention claimed is:

1. An optical RF spectrum analyser comprising:
    an optical modulator to modulate an input RF signal onto a carrier frequency to generate a modulated optical signal;
    an optical spectral weight module having a spectral weight function to modify the modulated optical signal, the optical spectral weight module defining a frequency relationship between the spectral weight function and the carrier frequency;
    a frequency control module to modify the frequency relationship between the spectral weight function and the carrier frequency over time by performing a sweep across a frequency range to modify the carrier frequency and the modulated optical signal to generate a modified optical signal over time;
    an optical sensor to sense the modified optical signal over time and to generate an RF signal over time based on the modified optical signal;
    a signal recovery module to calculate the RF spectrum based on the RF signal over time.

2. The spectrum analyser of claim 1, wherein the signal recovery module is configured to perform a deconvolution of the RF signal over time based on the spectral weight function.

3. The spectrum analyser of claim 2, wherein the deconvolution is based on an analytical approximation of the spectral weight function.

4. The spectrum analyser of claim 3, wherein the signal recovery module is configured to perform the deconvolution of the RF signal over time by using a waveform of the RF signal over time as a frequency domain signal.

5. The spectrum analyser of claim 4, wherein using the waveform of the RF signal over time as a frequency domain signal comprises creating a frequency axis associated with the RF signal over time based on a rate of modifying the frequency relationship between the spectral weight function and the carrier frequency over time.

6. The spectrum analyser of claim 5, wherein the optical spectral weight module is a resonator or an oscillator.

7. The spectrum analyser of claim 6, wherein the optical spectral weight module is a ring oscillator.

8. The spectrum analyser of claim 7 wherein the optical modulator comprises a laser source to generate a laser at the carrier frequency.

9. The spectrum analyser of claim 1, wherein modifying the relationship between the spectral weight function and the carrier frequency over time is based on a rate of change per unit time and the signal recovery module is to calculate the RF spectrum based on the rate of change.

10. The spectrum analyser of claim 9, further comprising:
    a bank of optical spectral weights each having a spectral weight function to modify the modulated optical signal, each spectral weight defining a frequency relationship between the spectral weight function and the carrier frequency; and
    an array of optical sensors to sense the modified optical signal over time and to generate multiple RF signals over time;
    wherein the signal recovery module is to calculate the RF spectrum based on the RF signal over time.

11. A method for analysing an input RF signal comprising:
    modulating the input RF signal onto an optical carrier frequency to generate a modulated optical signal;
    modifying the modulated optical signal by applying a spectral weight function using an optical spectral weight module, the optical spectral weight module defining a frequency relationship between the spectral weight function and the carrier frequency;
    modifying the relationship between the spectral weight function and the carrier frequency over time by performing a sweep across a frequency range to modify the carrier frequency and the modulated optical signal to generate a modified optical signal over time;
    sensing the modified optical signal over time to generate an RF signal over time based on the modified optical signal; and
    calculating a spectrum of the input RF signal based on the RF signal over time.

12. The method of claim 11, calculating the spectrum of the input RF signal comprises performing a deconvolution of the RF signal over time based on the spectral weight function.

13. The method of claim 12, wherein the deconvolution is based on an analytical approximation of the spectral weight function.

14. The method of claim 13, wherein performing the deconvolution of the RF signal over time comprises using a waveform of the RF signal over time as a frequency domain signal.

15. The method of claim 14, wherein using the waveform of the RF signal over time as a frequency domain signal comprises creating a frequency axis associated with the RF signal over time based on a rate of modifying the frequency relationship between the spectral weight function and the carrier frequency over time.

16. The method of claim 15, wherein modulating the input RF signal onto an optical carrier frequency comprises modulating the input RF signal onto multiple optical carrier frequencies simultaneously and the spectral weight function comprises multiple peaks corresponding to the multiple optical carrier frequencies.

17. The method of claim 16, wherein modifying the relationship between the spectral weight function and the multiple carrier frequencies comprises modifying a spacing between the multiple carrier frequencies or a spacing between the multiple peaks of the spectral weight function or both.

18. The method of claim 17, wherein modifying the relationship between the spectral weight function and the carrier frequency comprises tuning an optical filter.

19. The method of claim 18, wherein modifying the relationship between the spectral weight function and the carrier frequency comprises varying a carrier frequency of a laser source.

20. The method of claim 11, wherein modulating the input RF signal onto an optical carrier frequency comprises modulating the input RF signal onto multiple optical carrier frequencies simultaneously and modifying the relationship between the spectral weight function and the carrier frequency over time comprises coupling the modulated signal into a frequency dependent delay element to apply a different delay to each optical carrier frequency and the corresponding modulated input RF signal.

21. The method of claim 20, wherein modifying the relationship between the spectral weight function and the carrier frequency over time is based on a rate of change per unit time and calculating the RF spectrum is based on the rate of change.

22. The method of claim 21, further comprising applying frequency modulation to the input RF signal before modulating the input RF signal to increase a spacing between the optical carrier frequency and the modulated RF signal.

23. A method for controlling an RF signal analyser, the method comprising:
generating a modulator control signal to control modulation of an input RF signal onto a carrier frequency by an optical modulator to generate a modulated optical signal, and to modify a frequency relationship between a spectral weight function and the carrier frequency over time by performing a sweep across a frequency range to modify the carrier frequency and the modulated optical signal, the spectral weight function characterising a spectral weight to modify the modulated optical signal;
receiving a sensed RF signal over time indicative of the modified optical signal created by the performing of the sweep across the frequency range; and
calculating a spectrum of the input RF signal based on the RF signal over time.

\* \* \* \* \*